(12) United States Patent
Bednarcik et al.

(10) Patent No.: US 10,130,012 B2
(45) Date of Patent: Nov. 13, 2018

(54) DATA CENTER AIR ROUTING SYSTEM

(71) Applicant: Wright Line LLC, Worcester, MA (US)

(72) Inventors: Edward Bednarcik, East Greenwich, RI (US); Michael J. Tresh, Haverhill, MA (US); Brian Jackson, Waltham, MA (US)

(73) Assignee: EATON INTELLIGENT POWER LIMITED (IE)

( * ) Notice: Subject to any disclaimer, the term of this patent is extended or adjusted under 35 U.S.C. 154(b) by 144 days.

(21) Appl. No.: 14/746,170

(22) Filed: Jun. 22, 2015

(65) Prior Publication Data

US 2015/0327407 A1 Nov. 12, 2015

Related U.S. Application Data

(63) Continuation of application No. 12/605,992, filed on Oct. 26, 2009, now Pat. No. 9,066,450.

(60) Provisional application No. 61/108,066, filed on Oct. 24, 2008.

(51) Int. Cl.
H05K 7/20 (2006.01)
(52) U.S. Cl.
CPC ................. *H05K 7/20745* (2013.01)
(58) Field of Classification Search
CPC ....................................... H05K 7/20
USPC ..................................... 454/184
See application file for complete search history.

(56) References Cited

U.S. PATENT DOCUMENTS

| 4,495,545 | A | * | 1/1985 | Dufresne | H05K 7/20618 |
| | | | | | 361/692 |
| 7,477,514 | B2 | * | 1/2009 | Campbell et al. | 361/699 |
| 7,867,070 | B2 | * | 1/2011 | Day | H05K 7/20745 |
| | | | | | 454/184 |
| 8,320,125 | B1 | * | 11/2012 | Hamburgen | H05K 7/2079 |
| | | | | | 165/104.33 |
| 8,498,114 | B2 | * | 7/2013 | Martini | F24F 11/0001 |
| | | | | | 361/679.5 |
| 8,525,643 | B2 | * | 9/2013 | Green et al. | 340/5.8 |
| 8,701,737 | B2 | * | 4/2014 | Mainers | H05K 7/20745 |
| | | | | | 160/1 |
| 8,764,528 | B2 | * | 7/2014 | Tresh | H05K 7/20745 |
| | | | | | 361/691 |
| 9,313,927 | B2 | * | 4/2016 | Krietzman | H05K 7/20836 |

(Continued)

FOREIGN PATENT DOCUMENTS

WO 2011053515 5/2011

OTHER PUBLICATIONS

First Office Action in corresponding CN Application No. 201080058100; dated Jun. 24, 2014.

(Continued)

*Primary Examiner* — Steven B McAllister
*Assistant Examiner* — Samantha Probst
(74) *Attorney, Agent, or Firm* — Squire Patton Boggs (US) LLP

(57) ABSTRACT

An airflow management kit includes a plurality of vertical support posts and horizontal members that are configured to form a generally rectangular frame when assembled. The kit further includes sidewall blanking panels. When the kit is assembled and used with one or more IT racks, openings in the frame are covered by the sidewall blanking panels and one or more IT racks.

20 Claims, 17 Drawing Sheets

(56) References Cited

U.S. PATENT DOCUMENTS

| | | | |
|---|---|---|---|
| 2003/0164664 A1* | 9/2003 | Allexon | B65H 31/00 312/257.1 |
| 2006/0141921 A1* | 6/2006 | Turek | H05K 7/20572 454/184 |
| 2006/0187636 A1* | 8/2006 | Fink et al. | 361/695 |
| 2006/0260338 A1 | 11/2006 | VanGilder et al. | |
| 2007/0064389 A1 | 3/2007 | Lewis, II et al. | |
| 2008/0291626 A1* | 11/2008 | Nelson | F24F 1/0059 361/696 |

OTHER PUBLICATIONS

Second Office Action in corresponding CN Application No. 201080058100; dated Feb. 4, 2015.

\* cited by examiner

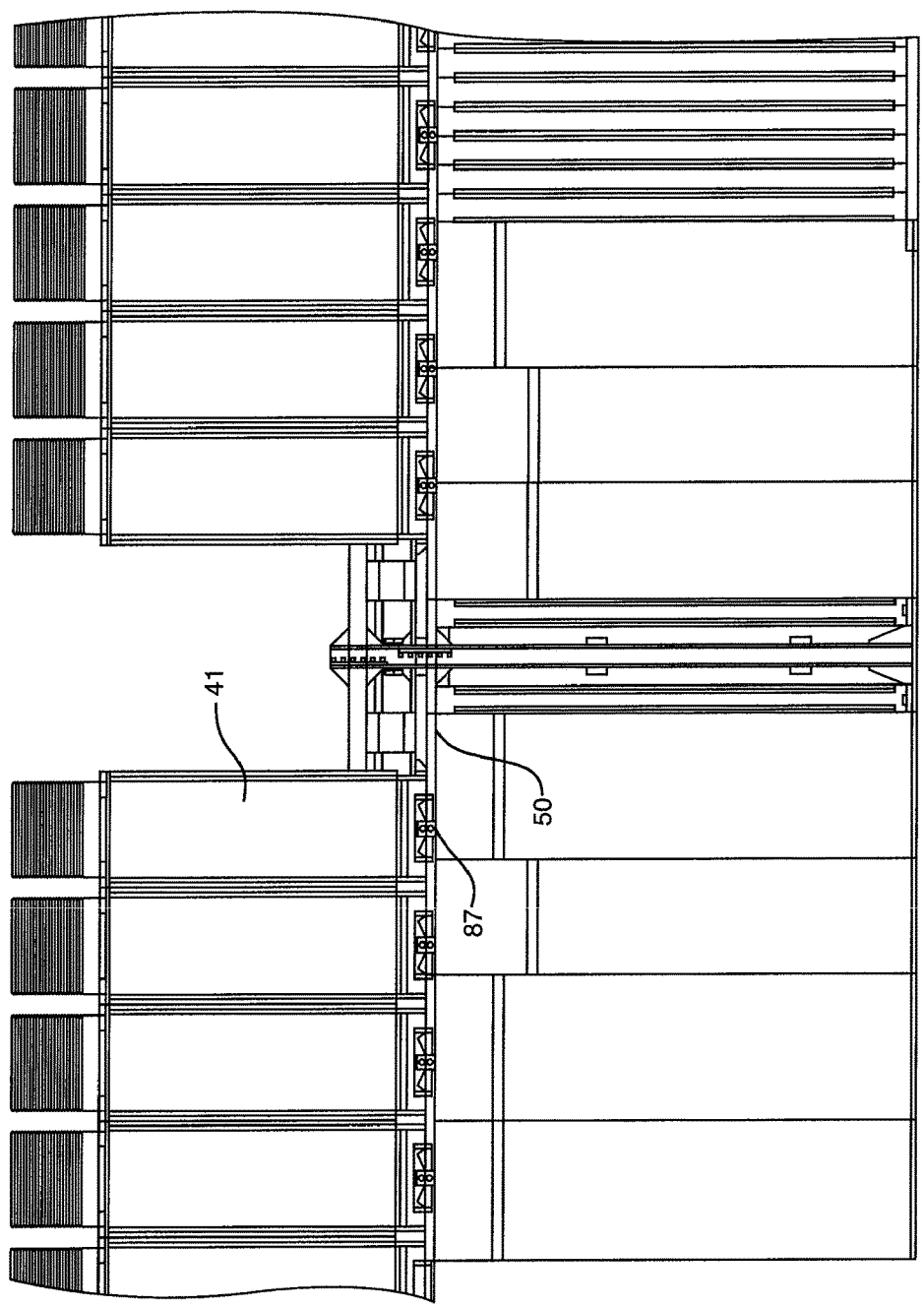

DATA CENTER AIR ROUTING SYSTEM

CROSS-REFERENCE TO RELATED APPLICATIONS

This application claims priority to U.S. non-provisional application Ser. No. 12/605,992, entitled "DATA CENTER AIR ROUTING SYSTEM," filed on Oct. 26, 2009, and U.S. provisional patent application Ser. No. 61/108,066, entitled "DATA CENTER AIR ROUTING SYSTEM," filed on Oct. 24, 2008, the entire contents of which are expressly incorporated by reference herein.

FIELD OF THE INVENTION

The invention relates generally to the field of data center airflow and temperature management. Specifically, the invention combines elements of both heat containment and cold air isolation systems to create a modular, configurable aisle isolation and containment system that applies to either hot or cold aisles and also to the combination of both.

BACKGROUND OF THE INVENTION

Companies that house data center rooms are faced with difficult challenges in providing the proper thermal environment for information technology (IT) equipment. IT equipment must operate under specific temperature ranges and data center rooms must be able to accommodate those ranges. Providing the appropriate temperature in a data center room may include using precision air conditioning for cooling, arranging the IT equipment into hot aisle/cold aisle configurations and allowing the hot air to flow freely to the return of the precision air conditioner. With higher levels of computing load, however, the ability to prevent hot and cold air from premixing is critical to the IT equipment's operability and the data center's overall efficiency. Proven methodologies to prevent cold air supply and hot air return from contaminating each other are required. An issue of particular importance that must be overcome with any air isolation method is being able to adjust to accommodate the wide range of equipment sizes and shapes. Compounding the problem, when data centers add new and different equipment the performance and efficiency of the original cooling infrastructure is impacted. New racks may not fit in the same footprint or have the same cooling needs. Implementing these moves, additions and changes is therefore difficult without a flexible system designed to meet these challenges.

Resource demands and constraints, including those related to power, represent a critical concern in the United States today. The increasing demand, and strain, placed upon electrical grids across the United States by data centers of all sizes is a material contributor to this issue.

The United States Environmental Protection Agency (EPA) addressed this issue in August 2007 and submitted a report to the United States Congress as part of public law to help define a vision for achieving energy efficiencies in data centers. The EPA predicts that by 2011, 2% of the United State's entire energy supply will be consumed by data centers.

Currently, data center managers are focused on the delivery of service and dependability. There has been little incentive, however, for data center managers to optimize the energy efficiency of their data center. In addition, the industry has not set any proper benchmarks for attainable energy efficiency targets, which further complicates the situation. Data center managers are primarily concerned about capital costs related to their data center's capacity and reliability. In most cases the energy costs are either hidden among other operating costs or simply absorbed as a cost of doing business. A study by the company IDC Global shows that for every $1.00 US of new server spend in 2005, $0.48 US was spent on power and cooling. This is a sharp increase from the year 2000, when the ratio was $0.21 US per $1.00 US of server spend. This ratio is anticipated to increase even further. It is expected, then, that the immediate demand to create more efficient data centers will be at the forefront of most company's cost saving initiatives.

Prior art legacy data centers typically have the following characteristics:

(1) An open air system that delivers cold air at approximately 55 degrees Fahrenheit (approximately 13 degrees Celsius) via overhead ducting, flooded room supply air, or a raised floor plenum;

(2) Perforated tiles (in a raised floor environment) that are used to channel the cold air from beneath the raised floor plenum into the data center;

(3) Computer racks, server enclosures and free-standing equipment orientated 180 degrees from alternate rows to create hot and cold aisles, which is an accepted best practice. Historically, however, information technology (IT) architecture has been the driving force in deciding the location of the racks and other equipment, leading to a disorganized and inefficient approach to air distribution;

(4) Computer racks, server enclosures and free-standing equipment that vary in size and shape;

(5) A minimum separation of 4 feet (approximately 1.2.2 meters) between cold aisles and 3 feet (approximately 0.91 meters) between hot aisles, based on recommendations from the American National Standards Institute (ANSI/TIA/EIA-942 April 2005), National Fire Protection Association (FPA), National Electric Code (NEC), and local Authority Having Jurisdiction (AHJ);

(6) Dedicated precision air conditioning units located at the nearest perimeter wall and generally in close proximity to IT racks. However, optimal placement of the computer room air conditioner (CRAC) for tree air movement is biased by structural columns, and often requires service clearances or other infrastructure accommodations;

(7) Traditional air conditioning systems are "turned on" on day one, and remain at full capability for cooling, even if only a small percentage of the design load is required; and (8) Existing air conditioning systems have limitations and are sensitive to the location of heat loads in and around the data center, and therefore are not resilient to changing configurations and requirements.

In practice, the airflow in the legacy data center is very unpredictable, and has numerous inefficiencies, which are proliferated as power densities increase. Problems encountered in a data center include: bypass airflow, recirculation, hot and cold air remixing, air stratification, air stagnation, and uncomfortable data center ambient room temperature.

Bypass Airflow

Bypass airflow is defined as conditioned air that does not reach computer equipment. The most common form of bypass airflow occurs when air supplied from the precision air conditioning units is returned directly back to the air conditioner's intake. Examples of this form of bypass airflow may include leakage areas such as air penetrating through cable cut-outs, holes under cabinets, or misplaced perforated tiles that blow air directly back to the air conditioner's intake. Other examples of bypass airflow include air that escapes through holes in the computer room perimeter walls and non-sealed doors.

A recent study completed by engineers from UpSite Technologies, Inc.™ and Uptime Institute, Inc.® concluded that in conventional legacy data centers only 40% of the air delivered from precision air conditioning units makes its way to cool the existing information technology (IT) equipment. This amounts to a tremendous waste in energy, as well as an excessive and unnecessary operational expense.

Recirculation

Recirculation occurs when the hot air exhausted from a computing device, typically mounted in a rack or cabinet, is fed back into its own intake or the intake of a different computing device. Recirculation principally occurs in servers located at the highest points of a high-density rack enclosure. Recirculation can result in potential overheating and damage to computing equipment, which may cause disruption to mission-critical services in the data center.

Hot and Cold Air Remixing and Air Stratification

Air stratification in a data center is defined as the layering effect of temperature gradients from the bottom to the top of the rack or cabinet enclosure.

In general, in a raised floor environment, air is delivered at approximately 55 degrees Fahrenheit (approximately 13 degrees Celsius) from under the raised floor through perforated tiles. The temperature of the air as it penetrates the perforated tile remains the same as the supply temperature. As the air moves vertically up the rack however, the air temperatures gradually increase. In high-density rack enclosures it is not uncommon for temperatures to exceed 90 degrees Fahrenheit (approximately 32 degrees Celsius) at the server intakes mounted at the highest point of the rack enclosure. The recommended temperature range however, for server intakes, as stated by ASHRAE Technical Committee 9.9 Mission Critical Facilities, is between 68 and 77 degrees Fahrenheit (approximately 20 to 25 degrees Celsius).

Thus, in a legacy data center design, the computer room is overcooled by sending extremely cold air under the raised floor, simply because there is a lack of temperature control as the air moves upward through the rack or cabinet enclosure.

In addition, because the hot air and the cold air are not isolated, and tend to mix, dedicated air conditioning units are typically located close to the rack enclosures, which may not be the most efficient or economical placement. In some situations, the most efficient or economical solution may be to use the building's air conditioning system, rather than having air conditioning units that are dedicated to the data center, or a combination of dedicated air conditioning units and the building's air conditioning system.

Air Stagnation

Large data centers typically have areas where the air does not flow naturally. As a result, the available cooling cannot be delivered to the computing equipment. In practice, data centers may take measures to generate air flow in these areas by utilizing air scoops, directional vanes, oscillating floor fans, and active fan-based floor tiles.

Uncomfortable Data Center Ambient Room Temperature

Data center ambient room temperature is not conditioned to comfortable working conditions. The ambient air temperature in a data center is typically determined by inefficiencies between providing cool air and removing heated air.

To address some of these concerns, data centers may be equipped with in-row air conditioning units, either in place of, or to supplement, larger computer-room air conditioners. These in-row cooling units extract hot air from the room or the hot aisle and return cooled air to the cold aisle. A particular in-row air conditioning unit, however, is constrained by its location, in that it may only be used to cool the equipment in the row in which is located. An in-row air conditioning unit's excess cooling capacity cannot be used to cool equipment racks in a different row. In addition, an in-row air conditioning unit does nothing to reduce the temperature in the hot aisle, and in some cases, may actually increase the temperature in the hot aisle beyond recommended safety limits.

There is a need in the art, then, for improved systems and methods for containing the air in both hot and cold aisles in data centers. In particular, there is a need to remedy the typical problems encountered in a data center, including the problems created by moves, additions and changes to IT equipment, as well as problems created by air flow inefficiencies such as bypass airflow, recirculation, hot and cold air remixing, air stagnation, and the like. This improved system would create a flexible aisle isolation and containment system designed to meet these challenges.

SUMMARY OF THE INVENTION

The system for managing airflow in a data center having at least one IT rack of the present disclosure provides reliable, dependable management of conditioned or exhausted air, and delivers and/or disposes of the air to address the previously-described air management issues.

In one embodiment of the system, a free-standing structure includes a frame that defines an interior aisle and has two side openings, a ceiling opening and two end openings. The frame includes four vertical support posts and two horizontal members that are each coupled to two of the vertical support posts. The frame further supports one or more sidewall blanking panels, which are coupled to the frame, and are releasably coupled to each other. The sidewall blanking panels cover at least a portion of the side openings of the frame when attached. At least one IT rack partially covers at least a portion of at least one side opening of the frame. Further, the system includes a door at one or both of the end openings, to allow personnel to enter or exit the interior aisle. The sidewall blanking panels, door, and IT rack are configured to limit air from entering or exiting the interior aisle.

Further, the horizontal members may include a plurality of slots for receiving a plurality of tabs on the sidewall blanking panels, to affix the sidewall blanking panels to the horizontal members. The system may also include a baffle frame including a baffle coupled to cross members that may be included between the horizontal members. One or more removable panels may cover the ceiling opening of the frame. Side-sealing panels may be included to fill space between the sidewall blanking panels and IT racks. The sidewall blanking panels may include flanges that allow them to interlock with one another. At least one of the side openings of the frame in this embodiment may be at least partially covered by two IT racks having different heights and/or widths. The system in this embodiment may further include a cable tray that extends between the vertical support posts, and that is configured to receive at least one cable. The cable tray in this embodiment may include two sides and a plurality of rungs between the two sides. Finally, the system may also include an adjustable blanking panel extending downwards from one of the horizontal members of the frame.

In another embodiment, a kit includes a plurality of vertical support posts and horizontal members that are configured to be assembled to form a generally rectangular frame having two side openings, a ceiling opening, and two end openings. The kit further includes one or more sidewall blanking panels configured to be removably coupled to the frame and to each other.

In this embodiment, the kit may also include one or more adjustable blanking panels configured to be removably coupled to the frame, and extend from one of the horizontal members to a top panel of an IT rack when assembled. The kit further may include one or more side-sealing panels to at least partially cover at least one side opening of the frame between a sidewall blanking panel and an IT rack when assembled. The ceiling opening of the temperature management kit may further be at least partially covered by one or more removable panels, and/or one or more air delivery/exhaust assemblies. In this embodiment, the temperature management kit may also include a cable tray extending along one of the upper horizontal members.

In a further embodiment, a data center airflow management structure includes a frame that defines an interior space and has at least two side openings and a ceiling opening. The structure further includes a plurality of full height sidewall blanking panels removably coupled to the frame, and releasably coupled to each other. The plurality of full height sidewall blanking panels in this embodiment are configured to cover at least a portion of a side opening of the frame. The structure further includes one or more adjustable blanking panels configured to cover at least a portion of a side opening. Collectively, the frame, full height sidewall blanking panels, and adjustable blanking panels operate in conjunction with an IT rack to cover the side openings of the frame.

In this embodiment, the data center airflow management structure may include a door located at one or both end openings of the interior space. Further, the frame, full height sidewall blanking panels, and adjustable panels may be configured to operate with at least two IT racks of different heights and/or widths to cover the side openings of the frame.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 5A, 5B and 5C are cross-sectional views of data center air routing systems, showing three different embodiments of air movement systems that may be incorporated into the data center air routing systems of the invention;

DETAILED DESCRIPTION OF THE PREFERRED EMBODIMENTS OF THE INVENTION

Figure 1:
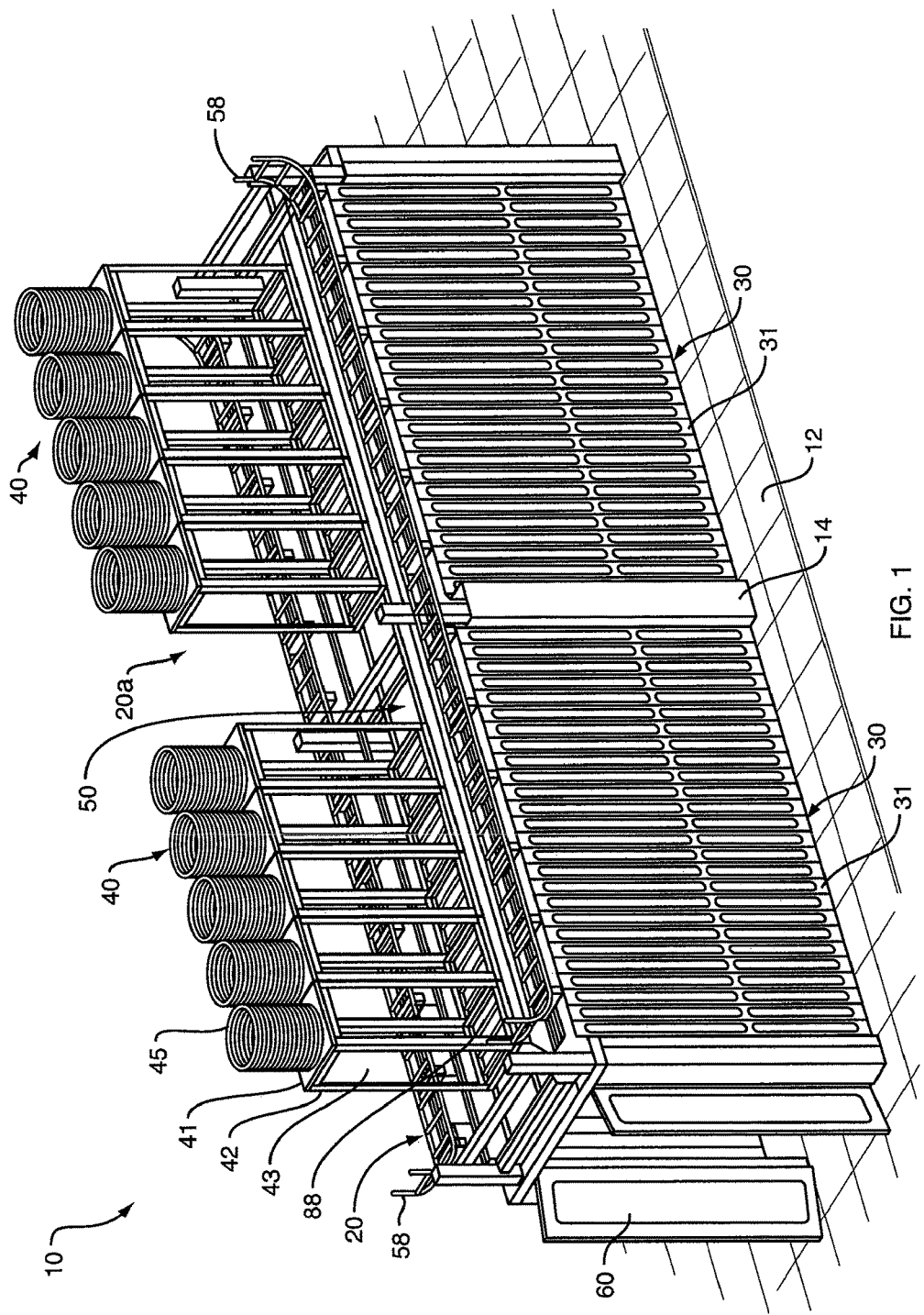
FIG. 1 is a perspective view a data center air routing system, in accordance with a preferred embodiment of the invention, comprising two mated modular system units, sidewall blanking panels that allow ambient light into the aisles of the modular system units, doors at each end of the data center air routing system, and ceiling air delivery/exhaust assemblies with duct sidewalls that allow ambient light into the aisles of the modular system units.
Figure 2:
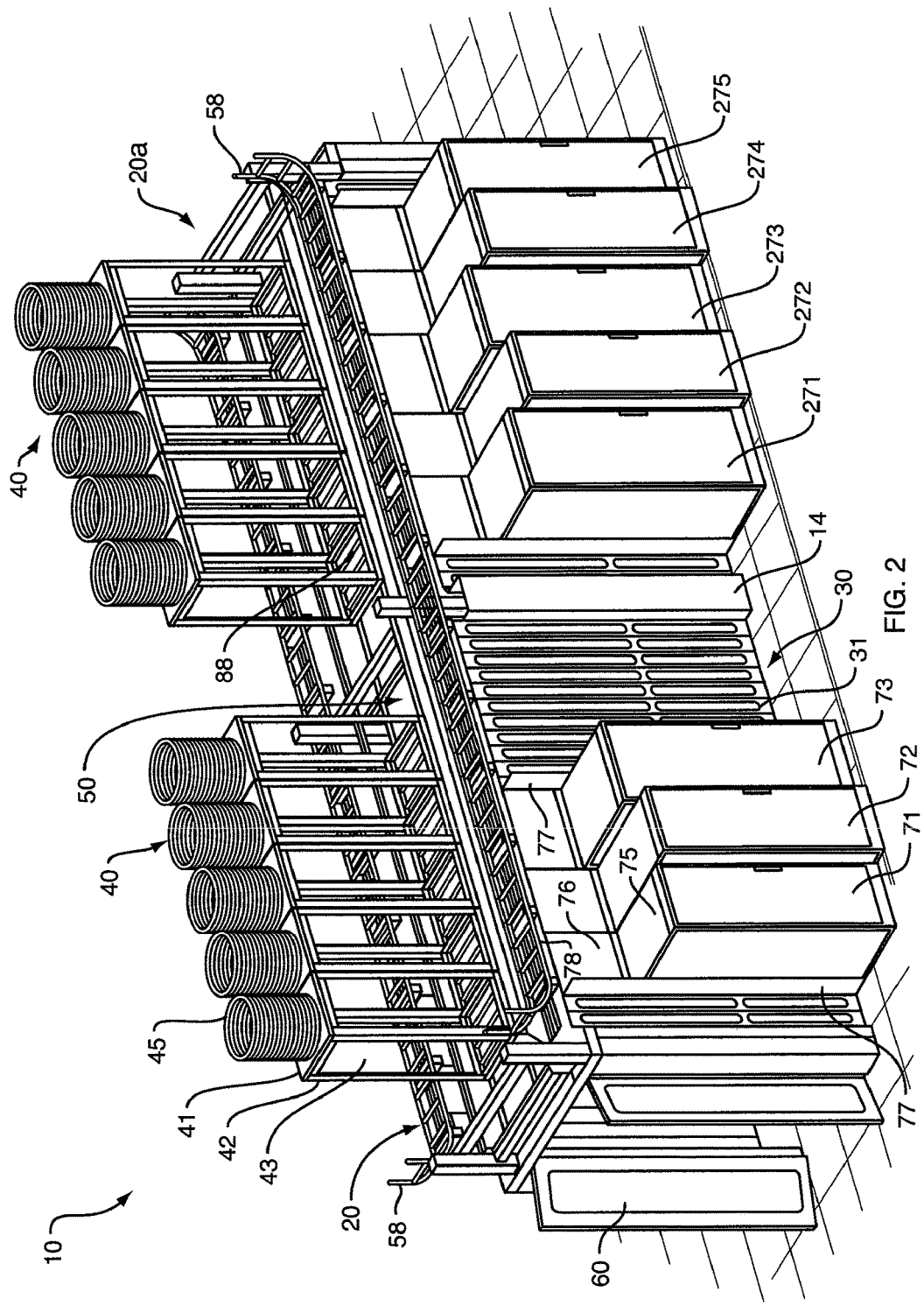
FIG. 2 is a perspective view of the data center air routing system of FIG. 1, showing the addition of IT racks coupled to the modular system units in place of one or more of the blanking panels.

In a preferred embodiment, and as shown in FIGS. 1 and 2, data center air routing system 10 comprises two free-standing, essentially identical, modular system units 20 and 20a. Note that in alternate embodiments, the data center air routing system of the invention may comprise only one modular system unit, or may comprise more than two free-standing, essentially identical, modular system units, which may be coupled end-to-end.

With further reference to FIGS. 1 and 2, modular system units 20 and 20a are preferably coupled together by connector structure 14, described below. Each modular system unit 20 (and 20a) is a generally rectangular, free-standing structure comprising two essentially identical sidewalk, such as sidewall 30, a ceiling 50, and two doors 60, one at either end of the modular system unit, thus forming an interior, enclosed aisle. While modular system unit 20 may further comprise an optional floor, in a preferred embodiment the modular system unit is configured to sit on the floor of the data center room in which it is located.

Note that in alternate embodiments, one of the doors may be replaced with a removable panel. When two or more such modular system units, such as modular system units 20 and 20a, are coupled together, as shown in FIGS. 1 and 2, the doors (or panels) at the mating ends can be removed to form a longer enclosed aisle, with an interior opening that extends from end-to-end, thus facilitating air flow. In alternate embodiments, one or more of the doors or panels at the mating ends may be left in place.

Data center air outing system 10 is constructed to be relatively air-tight such that the flow of cooled intake air or heated exhaust air can be carefully managed. One aspect of this construction comprises full-height, sidewall blanking panels 31 that are removable from the structure of modular system unit 20 (and 20a), as described below, to allow modular system unit 20 (and 20a) to be configured with gaps of varying height and width that can accept IT racks. As shown in FIG. 2, IT racks 71, 72 and 73 are coupled to sidewall 30 of modular system unit 20, and IT racks 271, 272, 273 and 274 are coupled to sidewall 30 of modular system unit 20a. In the embodiments shown in FIGS. 1 and 2, sidewall blanking panels 31 can be transparent or translucent to allow ambient light to enter the interior aisle of data center air routing system 10 to assist personnel working inside the aisle. In alternate embodiments, sidewall blanking panels can be opaque, or a combination of transparent, translucent or opaque, as desired. Modular system unit ceiling 50 can also comprise a series of optionally removable ceiling panels, described below, which may also be transparent or translucent such that ambient lighting can penetrate into the interior aisle of data center air routing system 10. In alternate embodiments, the ceiling panels may be opaque, or a combination of transparent, translucent or opaque, as desired.

The data center air outing system of the invention can be used to either route conditioned air into the IT racks, or to route heated exhaust air out from the IT racks and either out of the data center room or to the intake of the air conditioning unit for cooling or recirculation. The airflow into or out of the modular system units 20 and 20a is preferably accomplished through the modular system unit ceiling 50 and/or through the floor of the data center room, such as raised floor 12.

The embodiments shown in FIGS. 1 and 2 accomplish air flow through modular system unit ceiling 50, specifically through the use of a ceiling air delivery or exhaust assembly 40. Ceiling air delivery/exhaust assembly 40 comprises one or more air ducts 41. The air ducts 41 can be constructed in varying shapes and sizes, depending on the configuration of the data center room in which the data center air routing system is installed and on the specific use of the data center air routing system. In the embodiments shown in FIGS. 1 and 2, data center air routing system 10 is contemplated to be used in a data center room with a drop or suspended ceiling (not shown) that defines an air plenum for either conditioned air or exhaust air. To accommodate this data center room configuration, air ducts 41 may comprise flexible tubes 45 that can be coupled to a drop or suspended ceiling (not shown), and duct frames 42 that are coupled to modular system unit ceiling 50. The embodiments shown in FIGS. 1 and 2 also contemplate the use of optional transparent or translucent duct sidewalk 43 that contribute to ambient Hot infiltration into the interior of modular system units 20 and 20a. In alternate embodiments, duct sidewalls may be opaque, or a combination of transparent, translucent or opaque, as desired.

Also shown in FIGS. 1 and 2 are optional louvers or baffles 88 located between air duct 41 and the interior aisle of modular system units 20 and 20a. Louvers or baffles 88 seal the opening where air duct 41 meets modular system unit ceiling 50, and in a preferred embodiment, are balanced such that louvers or baffles 88 automatically open upon the pressure differential caused by airflow into or out of the air duct 41.

Data center air routing system 10 also provides for the optional routing of cables over the modular system unit 20 (and 20a). As shown in FIGS. 1 and 2, cable routing is accomplished by support structure and wire trays 58, which are coupled to the modular system unit duct frames 42 on each side of modular system unit ceiling 50.

FIG. 2 shows the data center air routing system 10 of FIG. 1 with eight IT racks, shown as references 71, 72 and 73 coupled to one side of modular system unit 20 and references 271, 272, 273 and 275 coupled to one side of modular system unit 20a, to illustrate one manner in which the system can be used. With further reference to FIG. 2, each of the IT racks includes a top panel, such as top panel 75 of IT rack 71. The IT racks are coupled to the modular system units by removing the appropriate number of sidewall blanking panels 31, and placing either the front or rear sides of the IT rack adjacent to sidewall 30, thus fluidly coupling the IT rack with the interiors of the modular system unit 20 or 20a.

In most cases, IT racks are designed to admit conditioned air into the front of the rack and exhaust heated air from the rear of the rack, hi this configuration, if the fronts of the IT racks are coupled to sidewall 30 and open to the interior of modular system unit 20, modular system unit 20 accomplishes a cold aisle into which conditioned air enters either through the modular system unit ceiling 50 and ceiling air delivery 40 or through openings in the raised floor 12 on which modular system unit 20 (and 20a) sits. In this configuration, heated air would be exhausted through the open rear sides of the IT racks. An alternative is to couple the IT racks to the modular system unit sidewalls 30 such that their rear sides are coupled to sidewall 30 and open to the interior of modular system unit 20, in which case the data center routing system accomplishes an enclosed hot aisle that routes heated exhaust air out of the data center room through exhaust assembly 40.

With further reference to FIG. 2, side-sealing panels 77 may be installed to assist in providing a relatively air-tight seal between the IT racks and the remaining sidewall blanking panels 31. Adjustable blanking panels 76 may also be installed to fill any gaps between IT rack top panel 75 and modular system unit frame edge 78. This construction maintains a relatively airtight coupling of the IT racks to the data cooling air routing system 10.

Figure 3:
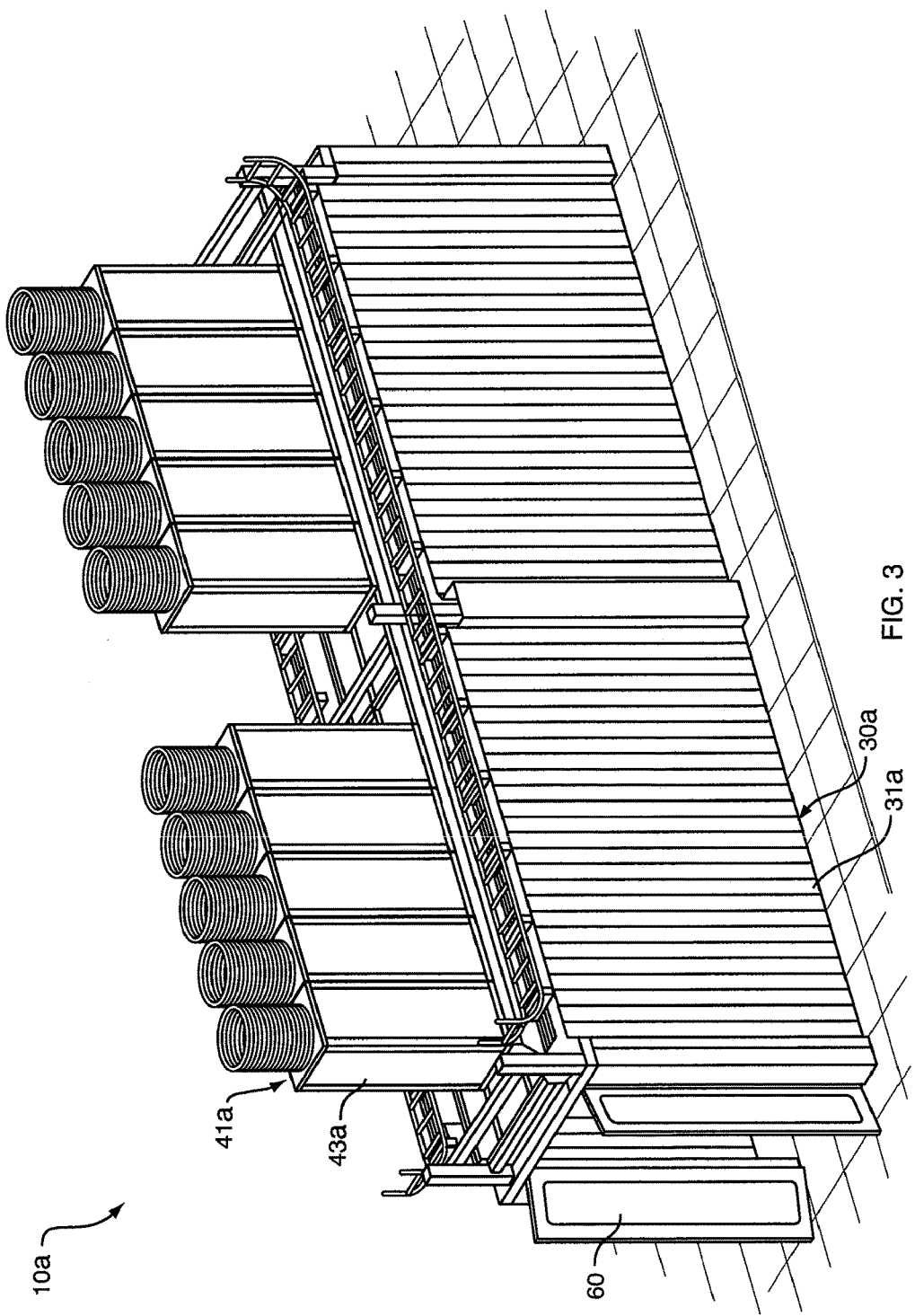
FIG. 3 is a perspective view of a data center air routing system, in accordance with a second preferred embodiment of the invention, comprising two mated modular system units, sidewall blanking panels that do not allow ambient light into the aisles of the modular system units, doors at the each end of the data center air routing system, and ceiling air delivery/exhaust assemblies with duct sidewalls that do not allow ambient light into the aisles of the modular system units.

FIG. 3 shows an alternate embodiment of a data center air routing system 10a. The embodiment shown in FIG. 3 is essentially identical to the embodiment shown in FIG. 1, with two differences. First, sidewall blanking panels 31a in FIG. 3 are opaque, to inhibit ambient light from penetrating into the interior aisle of the data center air routing system 10a. Second, duct sidewalls 43a are also opaque, to further inhibit ambient light from penetrating into the interior aisle of the data center air routing system 10a. Note that any combination of transparent/translucent and/or opaque sidewall blanking panels and/or duct sidewalk may be used to achieve the desired level of ambient light penetration into the interior aisle of the data center air routing system.

Figure 4:
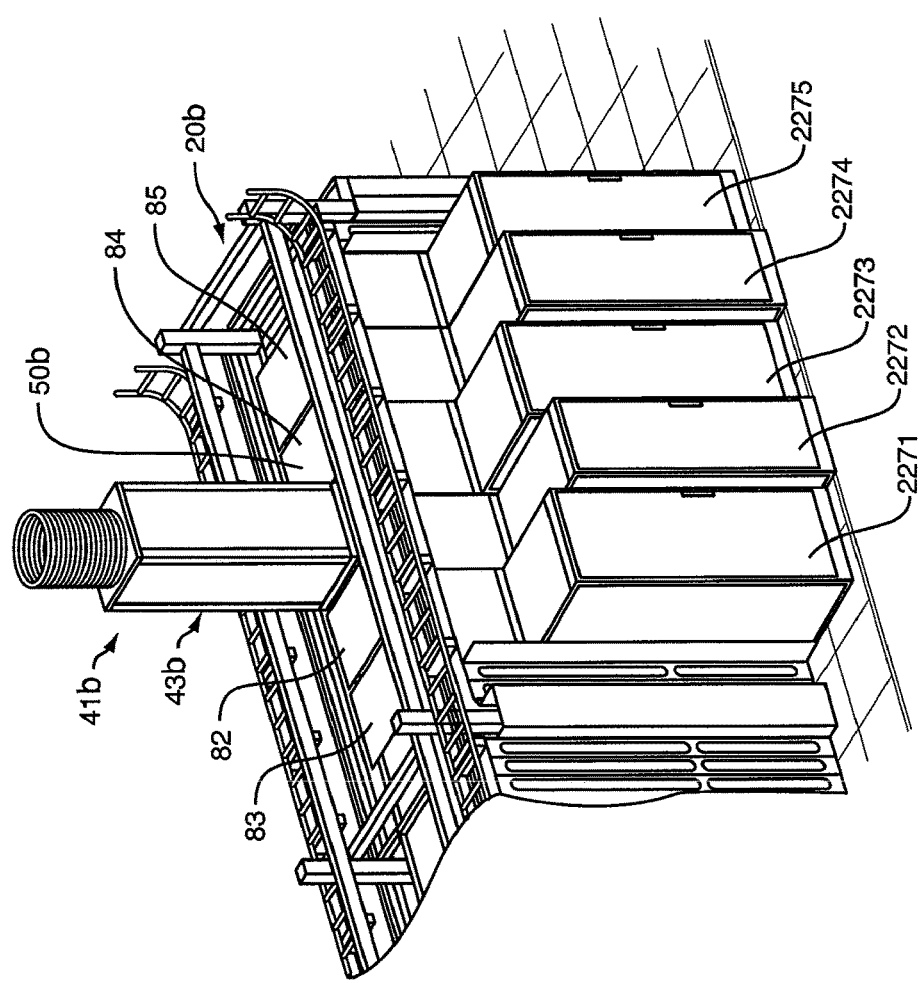
FIG. 4 is a detailed perspective view of a single air duct of a data center air routing system, shown coupled to the ceiling of a modular system unit to which a number of IT racks are coupled.

FIG. 4 shows a single air duct 41b of a data center air routing system, shown coupled to the ceiling 50b of a modular system unit 20b to which a number of IT racks, 2271 through 2275, are coupled. As shown in FIG. 4, modular system unit ceiling 50b comprises a number of separately removable ceiling panels 82, 83, 84 and 85. A single air duct 41b has been coupled to the modular system unit ceiling 50b via the removal of one such ceiling panel. FIG. 4 illustrates one of many possible constructions, and in alternate embodiments, more than one separate air duct, similar to air duct 41b, may be coupled to modular system unit ceiling 50b to provide airflow sufficient for the particular application. Note that one or more of the ceiling panels 82 through 85 may be transparent or translucent that ambient lighting can penetrate into the interior aisle of data center air routing system, or opaque to inhibit ambient light from penetrating into the interior aisle of the data center air routing system, or any combination thereof. Similarly, the duct sidewalk 43b can be translucent, transparent, or opaque, or any combination thereof.

Figure 5B:
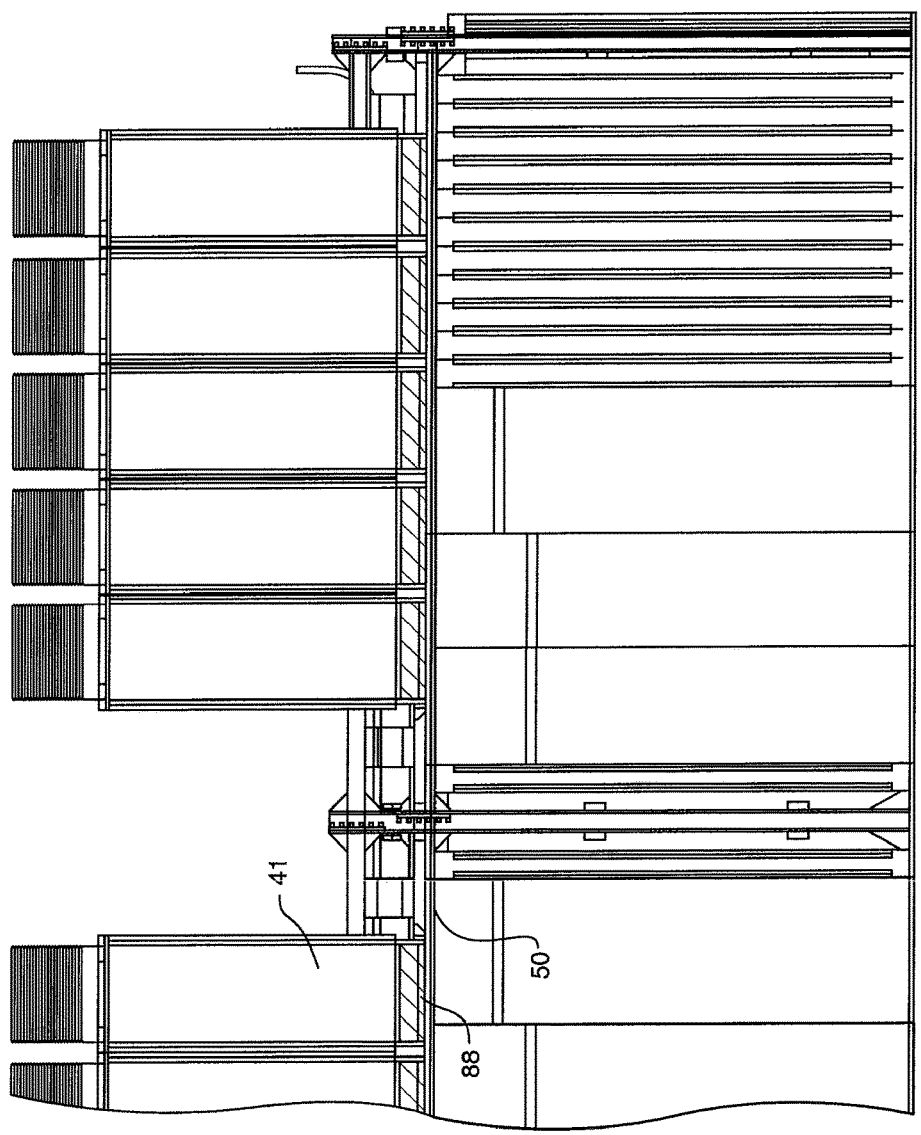
Figure 5C:
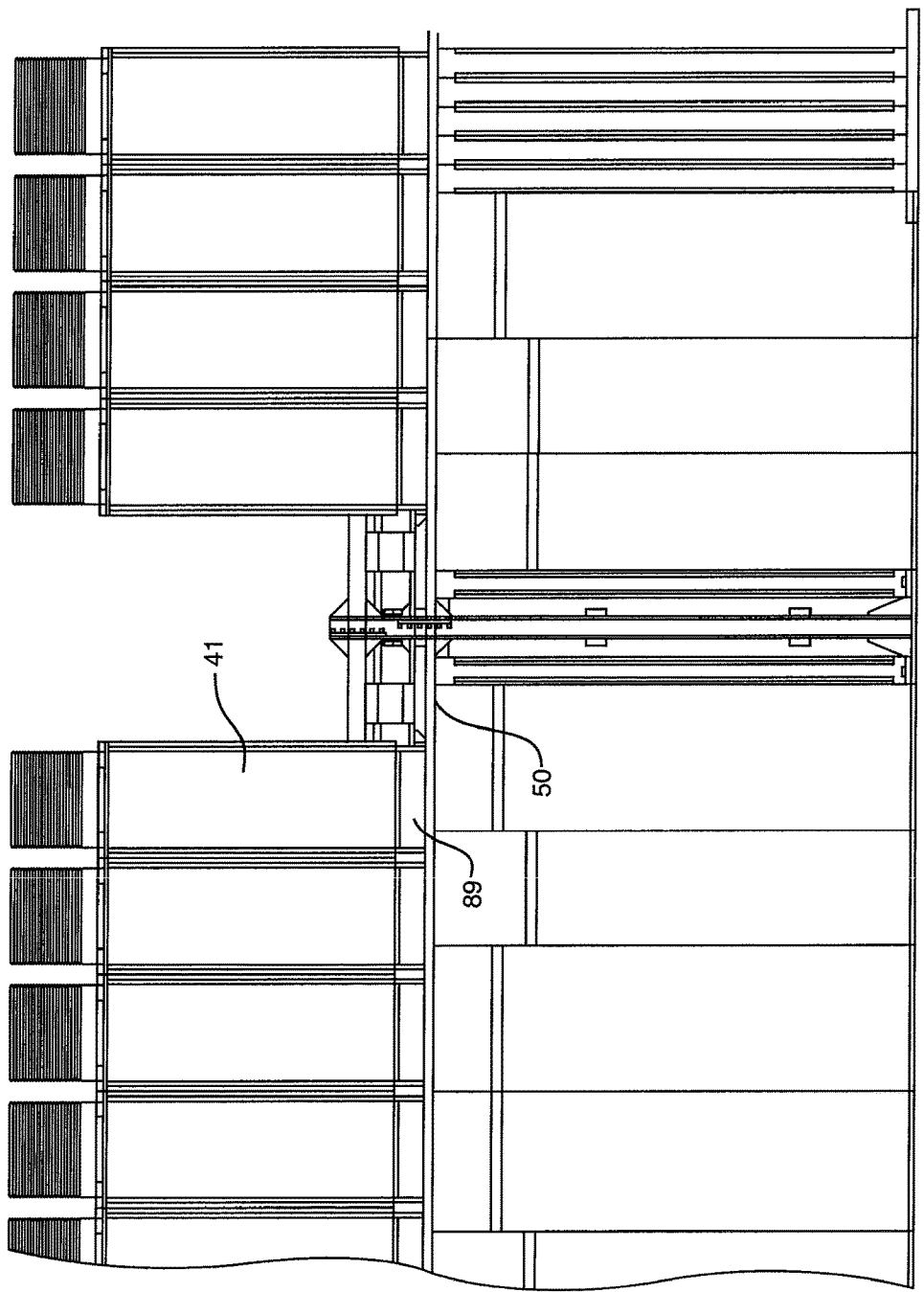

FIGS. 5A, 5B and 5C show three embodiments of air movement systems that may be incorporated into the data center air routing systems of the invention. FIG. 5A is cross-sectional view of a data center air routing system with at active air movement system comprising fan 87 located at the intersection of air duct 41 and modular system unit ceiling 50. FIG. 5B is a cross-sectional view of a data center air routing system showing an alternative air movement system comprising louvers or baffles 88 that open when the air duct 41 is in use and automatically close when the air duct 41 is not in use, in order to prevent air infiltration or egress in the interior aisle of the data center air routing system. FIG. 5C is a cross-sectional view of a data center air routing system with a passive air management system comprising an opening 89 for air inlet/outlet at the intersection of air duct 41 and modular unit ceiling 50.

Figure 6A:
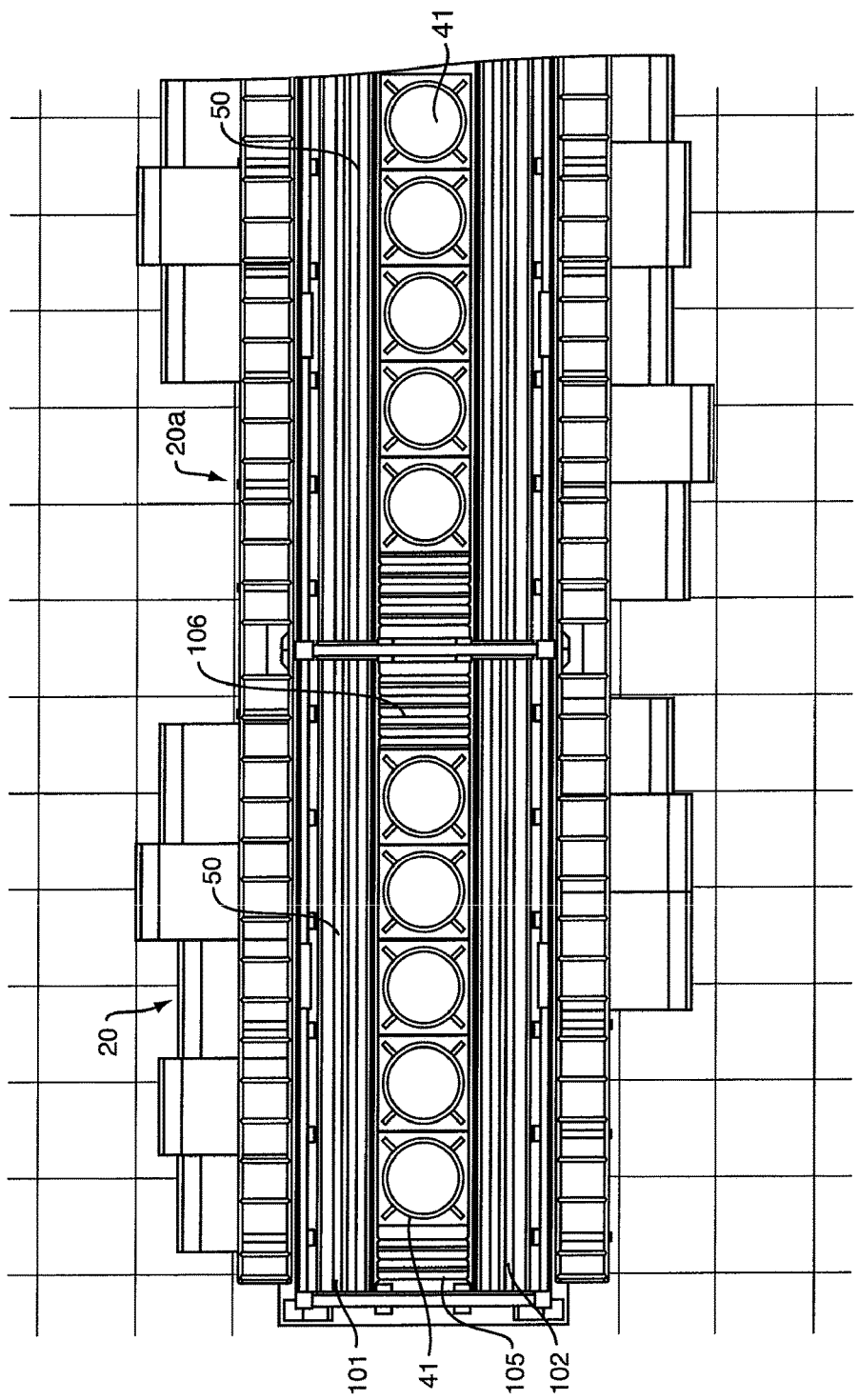
FIG. 6A is a top view of a portion of a data center air routing system comprising two modular system units, with five air ducts coupled to each modular system unit, where the air ducts are centered in the modular system units.
Figure 6B:
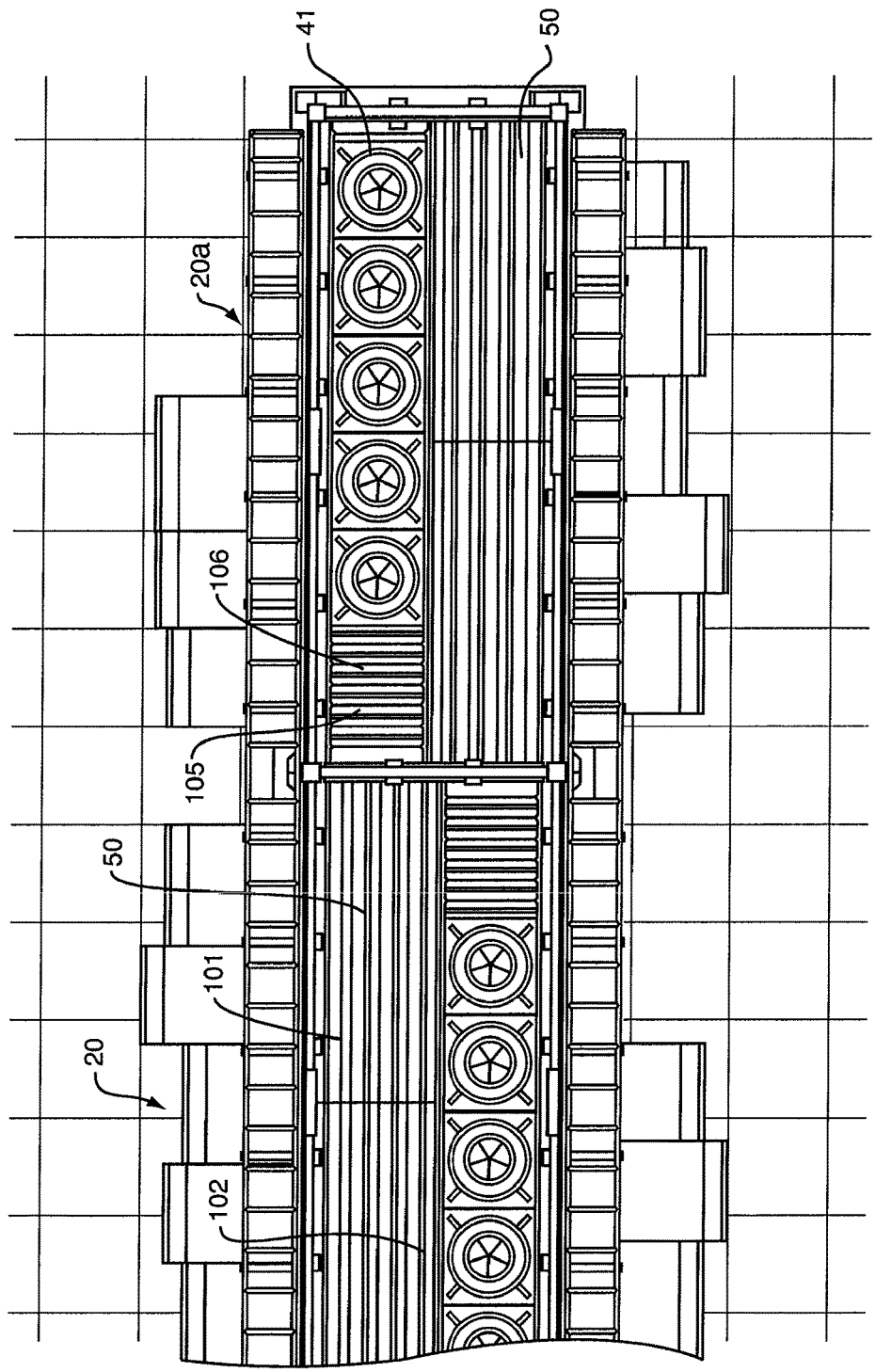
FIG. 6B is top view of a portion of a data center air routing system comprising two modular system units, with five air ducts coupled to each modular system unit, where the air ducts are coupled to one side and at one end of each of the modular system units.

FIGS. 6A and 6B show two different configurations for coupling the ceiling air delivery/exhaust assembly 40, and specifically the air ducts 41 to the modular system unit ceiling 50. With reference to FIG. 6A, air ducts 41 are located in the center of modular system unit ceiling 50 of each of units 20 and 20a. Modular system unit ceiling 50 comprises left and right removal panels 101 and 102, and center removable panels 105 and 106. Five air ducts 41 are located between panels 101 and 102.

FIG. 6B shows an alternate arrangement for coupling the ceiling air delivery/exhaust assembly 40 to modular system unit ceiling 50, in which air ducts 41 are located towards one side of each modular system unit 20 and 20a. Air ducts 41 are further located adjacent to one another and adjacent to one end of each modular system unit 20 and 20a. The configuration shown in FIG. 6B is accomplished by moving ceiling panel 102 such that it abuts ceiling panel 101, and moving ceiling panel 105 such that it abuts ceiling panel 106, thus creating a gap sufficient for coupling air ducts 41 in the open space, as shown.

Figure 7:
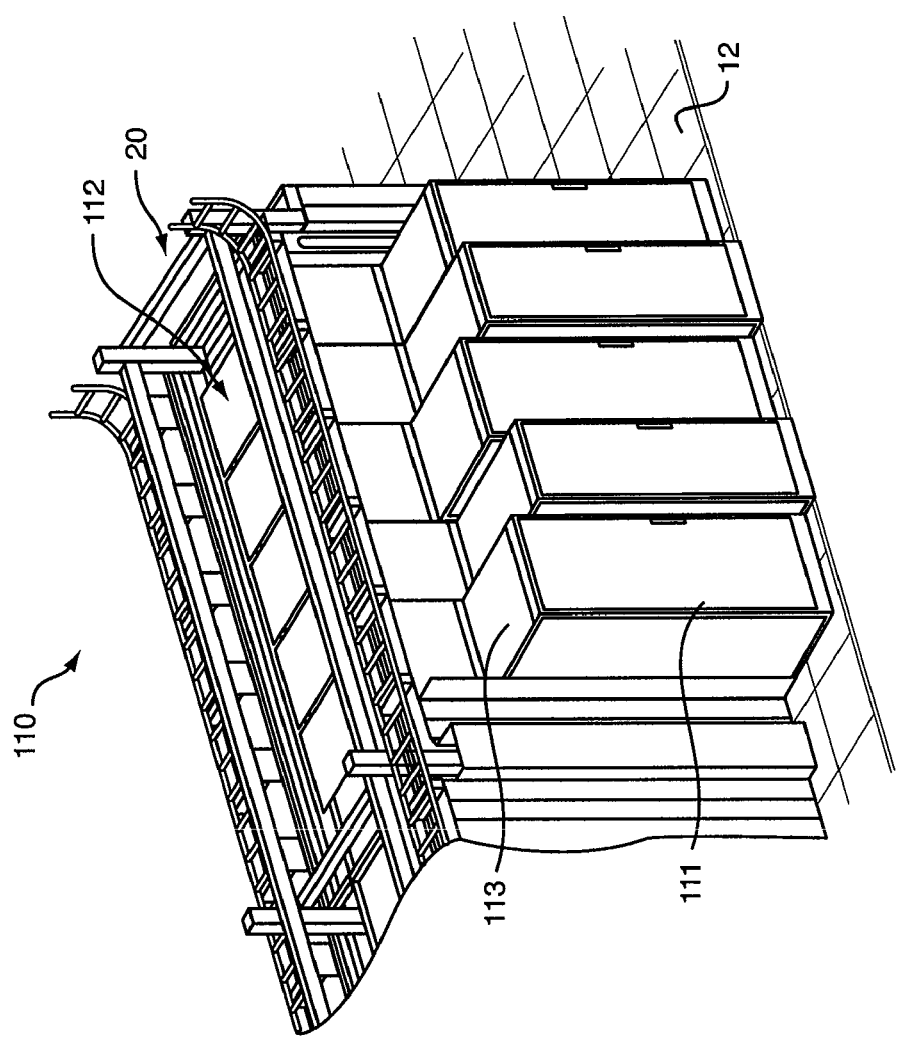
FIG. 7 is a perspective view of a portion of a data center air routing system used as a cold aisle, in which conditioned air is supplied to the interior of the data center air routing system through a raised floor air supply plenum.

FIG. 7 shows an alternative embodiment of data center air routing system 110, adapted to be used as a cold aisle, in which modular system unit ceiling 112 is unbroken, and cold air is admitted into the interior of modular system unit 20 through openings in raised floor 12. The provision of conditioned air from below a raised floor for the use of IT racks is known in the art, thus the floor plenum and the openings are not shown in these drawings. In the embodiment shown in FIG. 7, heated air is exhausted from the rear side of the IT racks, such as rear side 111 of IT rack 113.

Figure 8:
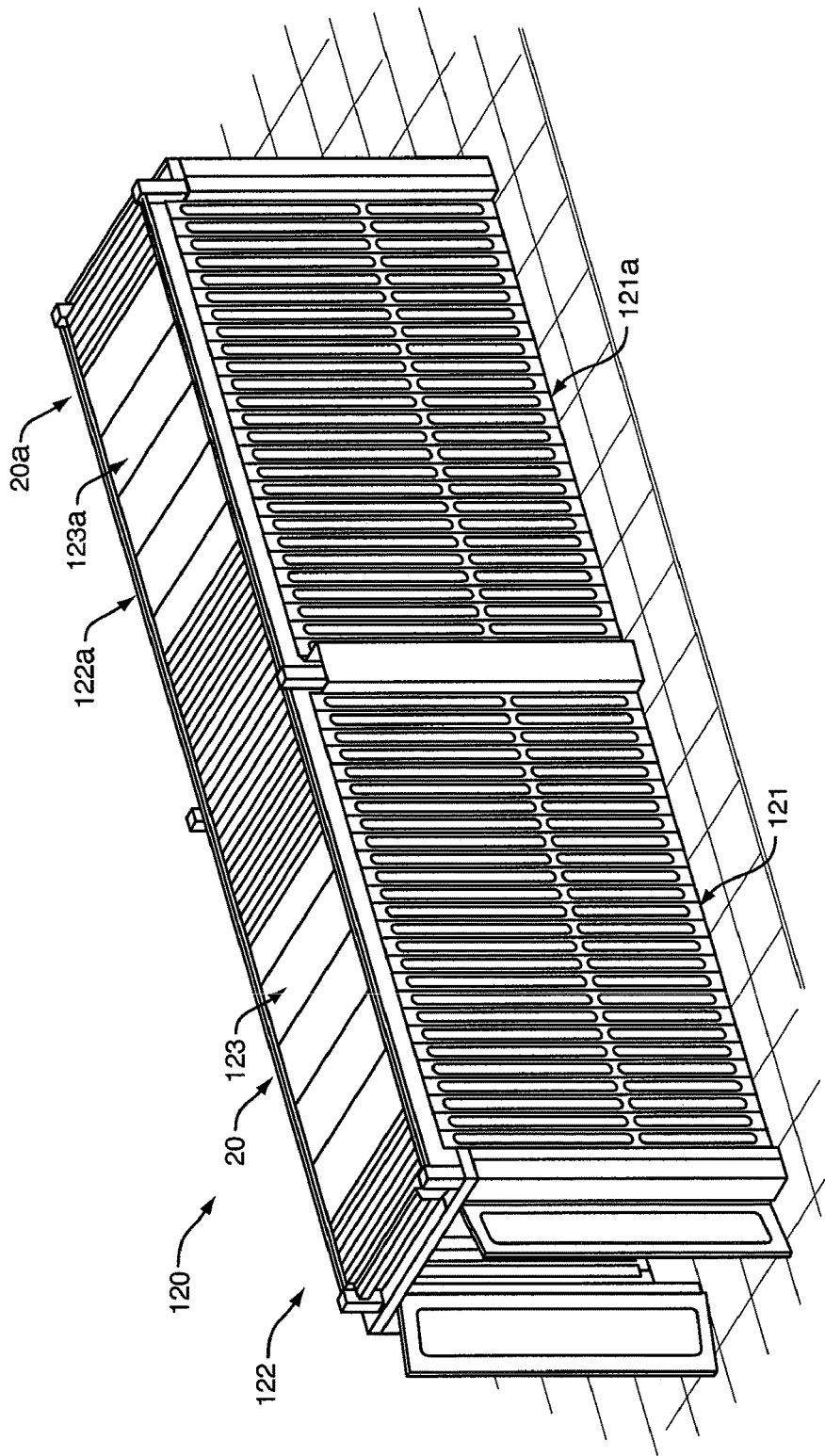
FIG. 8 is a perspective view of an additional preferred embodiment of a data center air routing system.

FIG. 8 shows an alternative embodiment of data center air routing system 120, in which modular system units 20 and 20a comprise fixed ceilings 123 and 123a, and removable sidewall blanking panels 121 and 122, and 121a and 122b. Note that ceilings 121 and 123a, and/or sidewall blanking panels 121, 122, 1211a and 122b may be translucent, transparent, or opaque, or a combination thereof. If used as a cold aisle, the cooling could be accomplished by an in-row type conditioning unit (not shown) coupled to one of the modular system unit sidewalk 121, 122, 121a, or 122a in place of an IT rack.

Figure 9A:
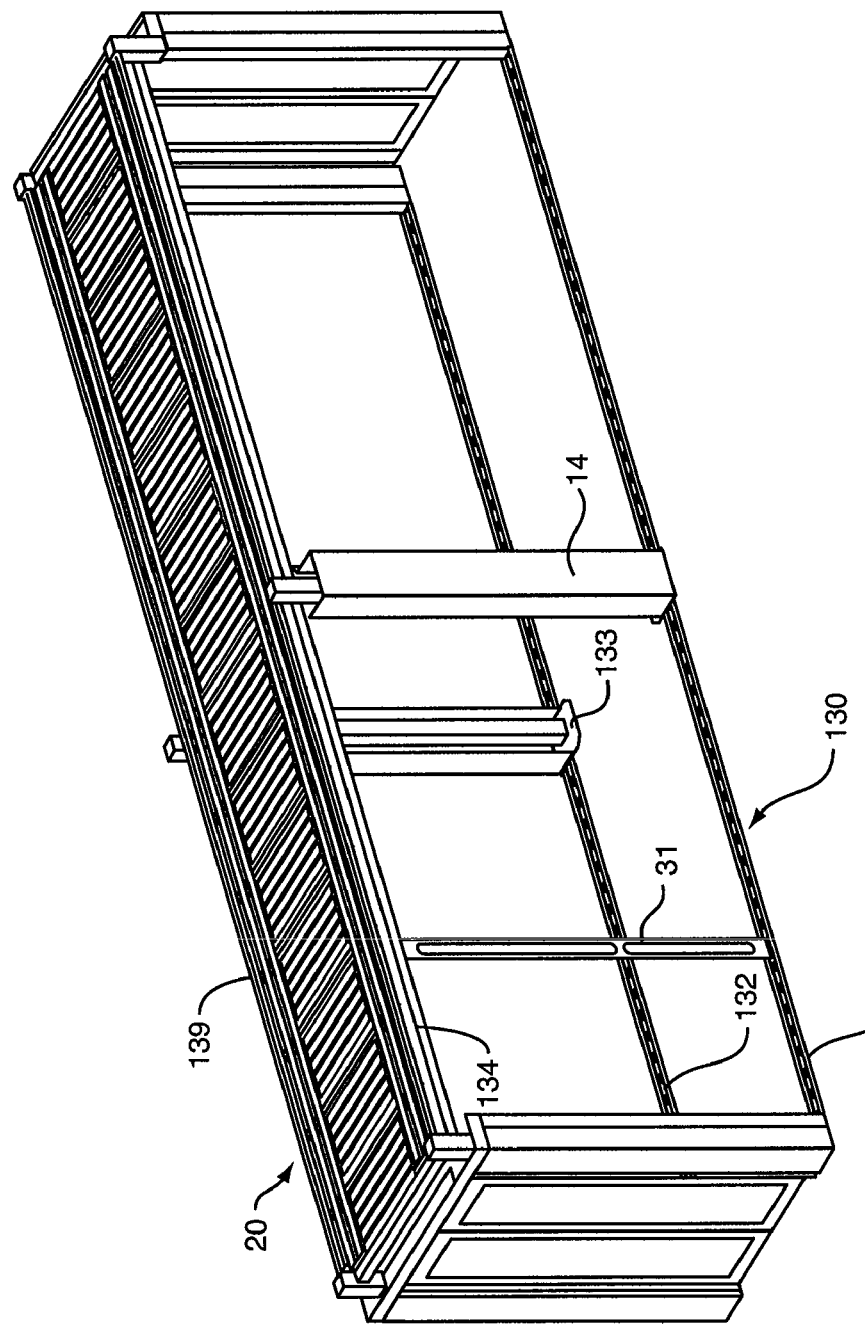
FIG. 9A is a perspective view of a frame of a modular system unit according to a preferred embodiment of the invention.
Figure 9C:
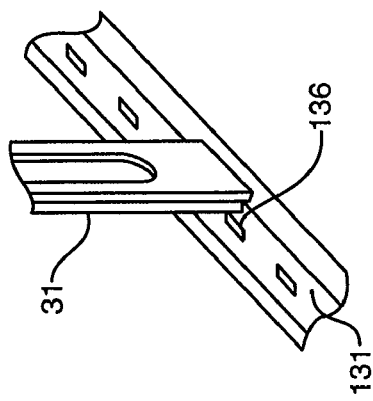
FIGS. 9B and 9C are detailed views of the construction of the frame of FIG. 9A, showing the coupling of sidewall blanking panels to the frame.

FIG. 9A shows a frame 130 for a modular system unit 20. Frame 20 comprises lower horizontal members 131 and 132, and upper horizontal members 134 and 139. Lower horizontal members 131 and 132, and upper horizontal members 134 and 139 are connected at both ends to four vertical support posts 133, one at each of the four corners of the modular system unit 20. Also shown in FIG. 9A is sidewall blanking panel 31. The manner in which sidewall blanking panel 31 is removably coupled to upper horizontal member 134 is shown in FIG. 9B, and the manner in which sidewall blanking panel 31 is removably coupled to lower horizontal member 131 is shown in FIG. 9C.

Figure 9B:
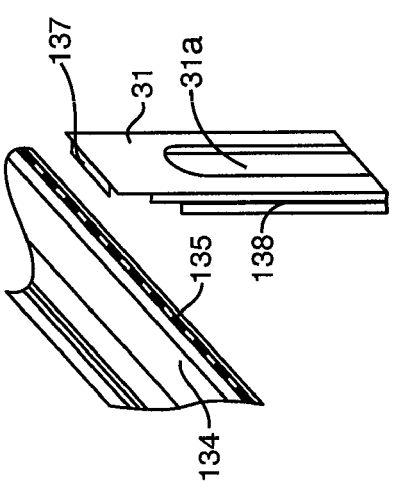

As shown in FIG. 9B, sidewall blanking panel 31 comprises central clear or translucent window or windows 31a. Both the left and right sides of sidewall blanking panel 31a further define a side flange 138. Side flange 138 is shaped to interlock with a flange of an adjacent sidewall blanking panel 131. The interlocking construction serves to both provide structural integrity and block airflow between two sidewall blanking panels. Sidewall blanking panel 31 carries protruding tab 137 at its top that fits into one of slots 135 in upper horizontal member 134. A similar protruding tab is located on the bottom of sidewall blanking panel 31 (not shown) and is adapted to fit into one of slots 136 in lower horizontal member 131, as shown in FIG. 9C. This construction allows the sidewall blanking panel 31 to be easily connected to and removed from frame 130.

Figure 10:
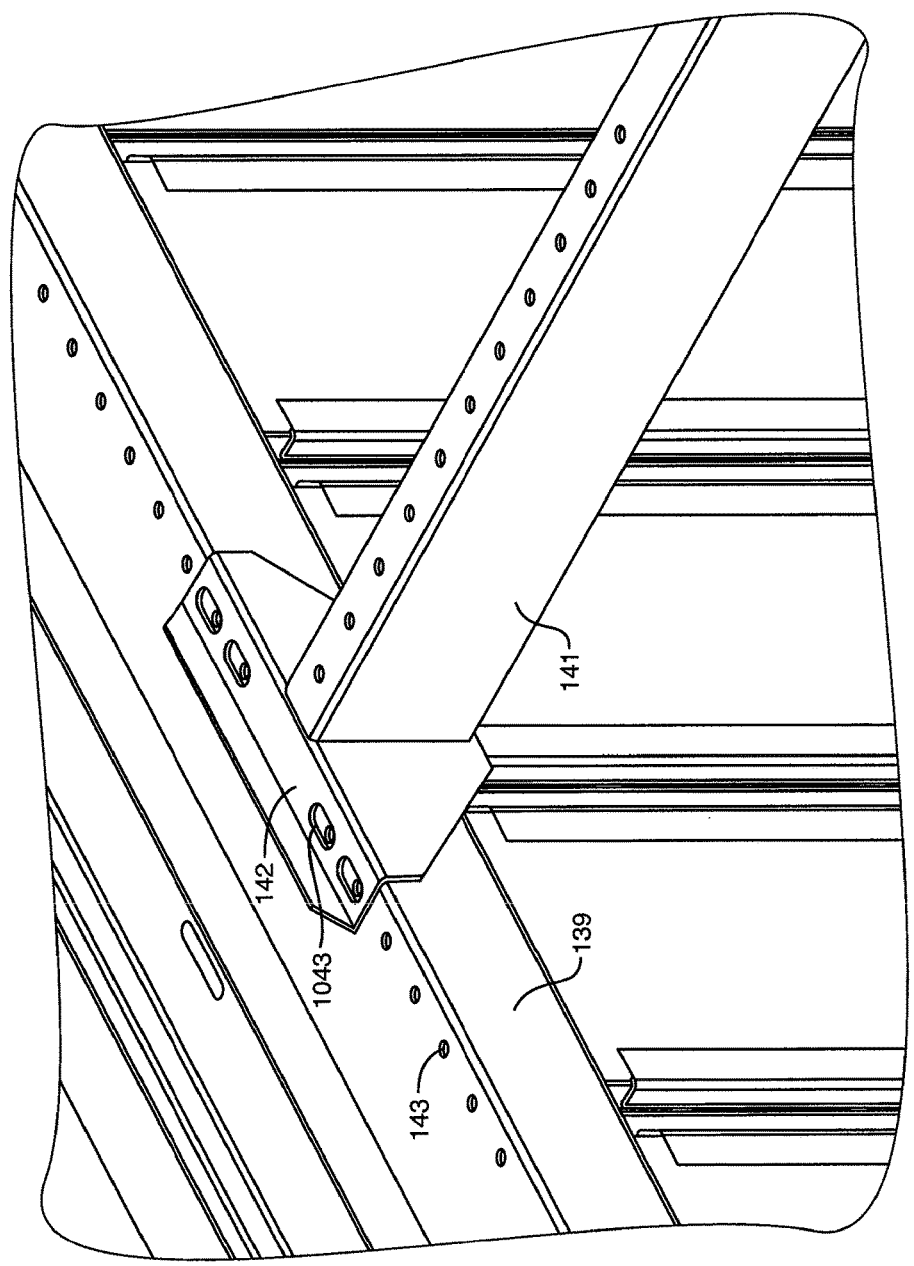
FIG. 10 is an additional detailed view of the construction of the frame of FIG. 9A, showing the coupling of an upper cross member to an upper horizontal member.

FIG. 10 shows a preferred construction of upper cross member 141 and its connection to upper horizontal member 139. Also shown in FIG. 10 is upper cross member 141, which is used to stabilize frame 130. Each upper cross member 141 comprises end flange 142, which includes slots 1043 that allow for variable alignment with the holes 143 along the top edge of upper horizontal member 139. This configuration of slots 1043 and holes 143 allows upper cross members 141 to be easily added, removed or moved as desired.

With further reference to FIGS. 2 and 9A, connector structure 14 is mounted directly onto two adjacent vertical support posts, one each from modular system unit 20 and modular system unit 20a. Connector structure 14 acts as an air containment shroud, to assist in providing a relatively air-tight seal between the two modular system units 20 and 20a.

Figure 11:
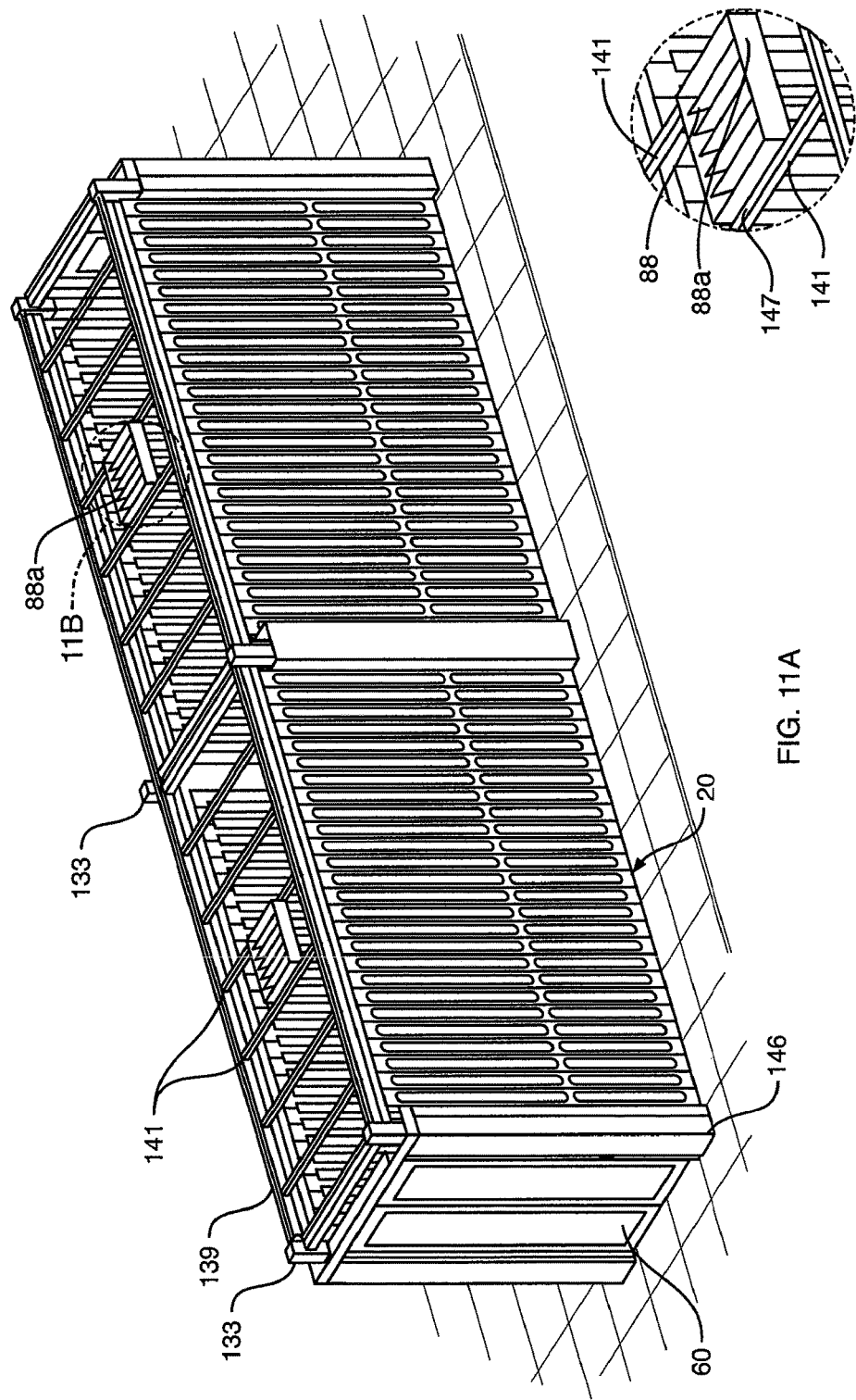
FIGS. 11A and 11B are additional detailed views of the construction of the frame of FIG. 9A, showing the addition of baffles.

As shown in FIGS. 11A and 11B, cross members 141 also allow for the mounting of baffle frame 88a, which carries baffles 88. Baffle flume 88a comprises one or more flanges 147 that sit on top of and are aligned with openings on the top of cross member 141. The flange/opening combination allows for variable placement of baffle frame 88a along the length of cross member 141, such that baffle frame 88a may be positioned along the left side, right side or in the center of modular system unit 20. Also shown in FIG. 11A are optional decorative corner pieces 146 that abut door 60 to provide a more finished appearance than would be presented by vertical structural members 133 alone.

Figure 12:
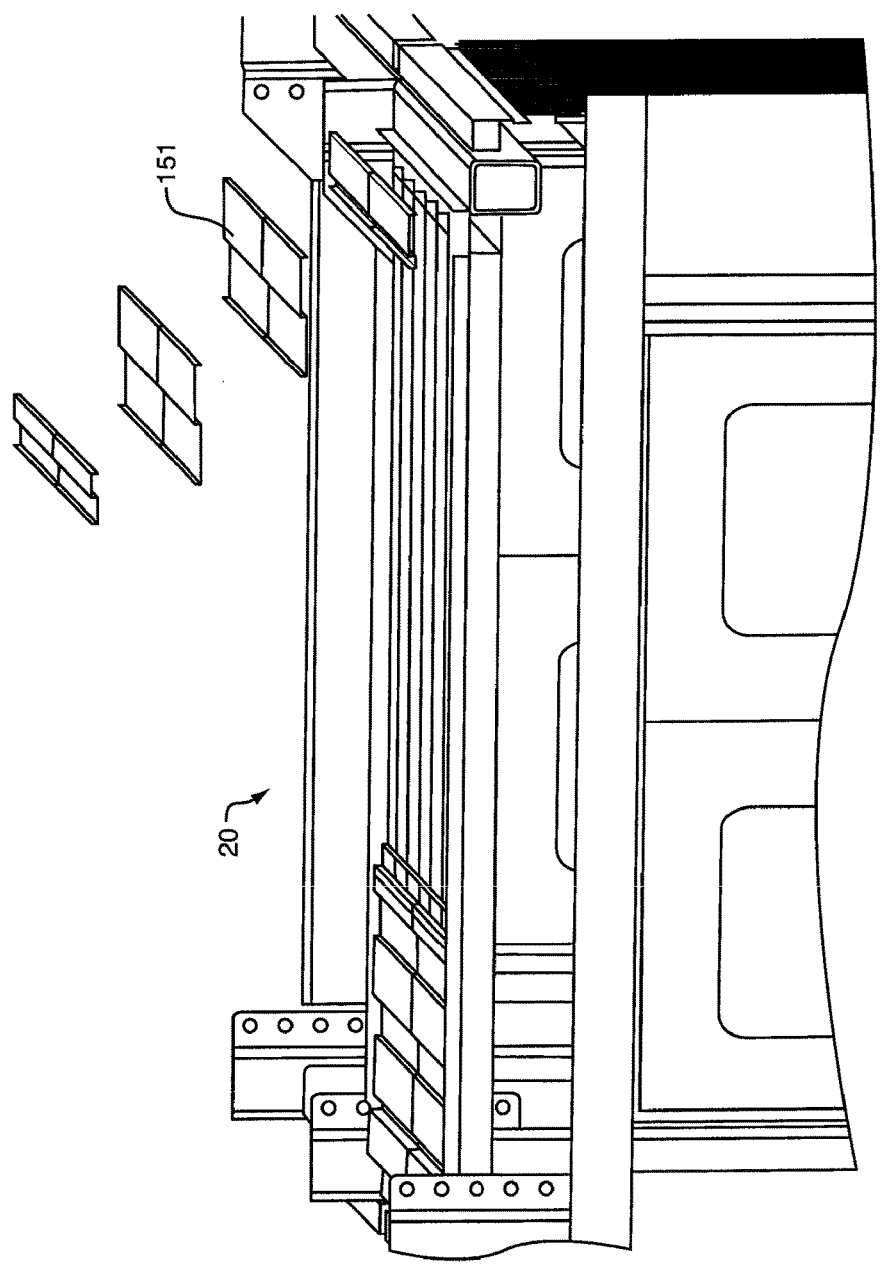
FIG. 12 is a perspective view of a portion of the top of a data center air routing system, showing one manner of coupling ceiling panels or tiles.
Figure 13:
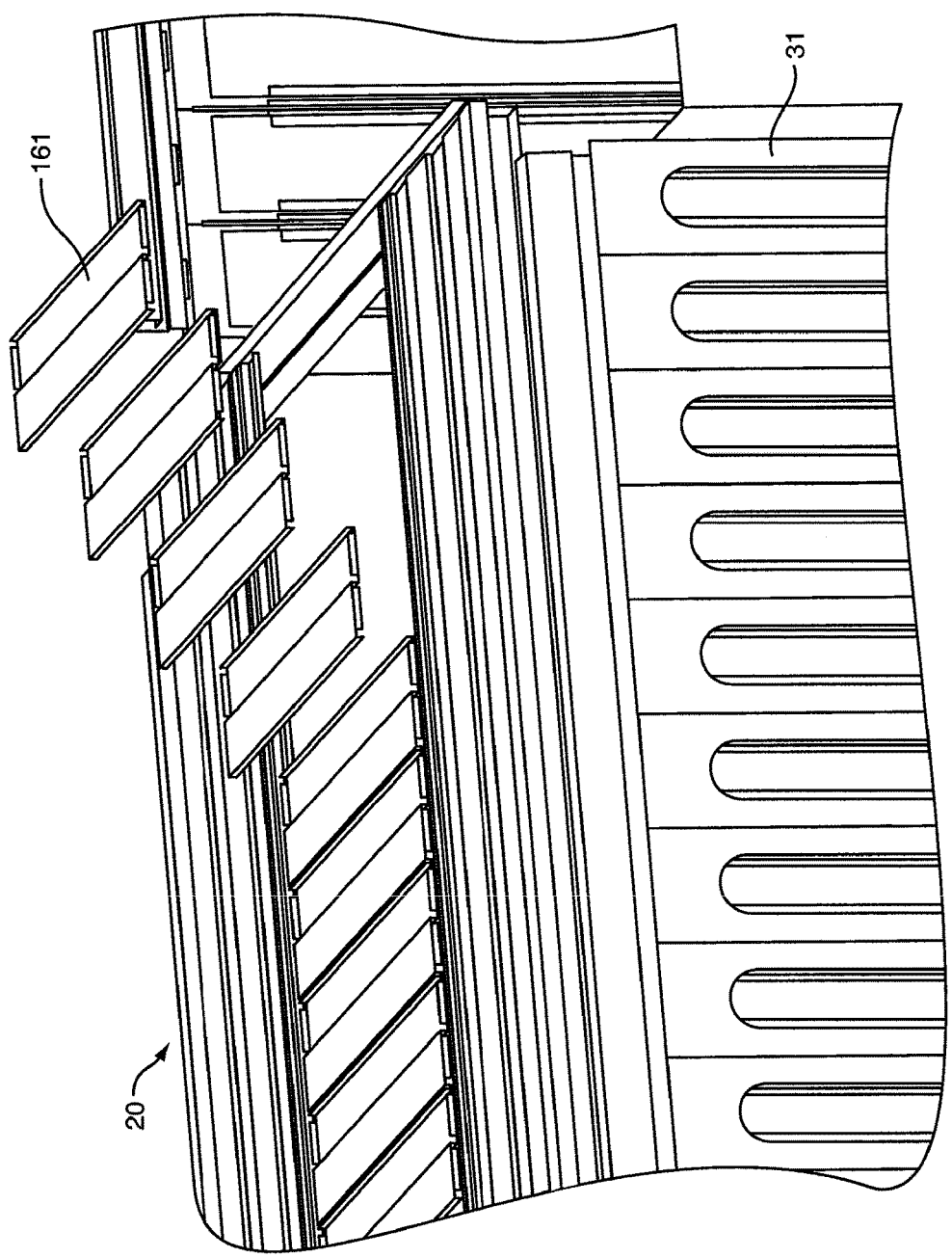
FIG. 13 is a perspective view of a portion of the top of a data center air routing system, showing a second manner of coupling ceiling panels or tiles.

FIGS. 12 and 13 show two possible embodiments of modular system ceiling tiles. In both embodiments, the ceiling tiles are overlapping, interlocking, and individually removable. As shown in FIG. 12, ceiling tiles 151 are gravity-interlocked such that they float or nest upon one another. Specifically, ceiling tiles 151 overlay one another in a manner that allows them to slide toward and away from one another while still remaining overlapped. This particular construction provides a continuous but adjustable modular system unit ceiling that can be adjusted to accommodate the ceiling air ducts.

As shown in FIG. 13, ceiling tiles 161 are laid across the width of the ceiling and also overlap and interlock. Unlike ceiling tiles 151, ceiling tiles 161 are preferably mechanically fastened. In this embodiment, the ceiling ducts can be accommodated by removing the required number of tiles.

The particular construction, materials and dimensions described herein are not limitations of the invention, as other constructions can accomplish the invention described herein.

Although specific features of the invention are shown in some figures and not others, this is for convenience only, as some features may be combined with any or all of the other features in accordance with the invention.

Recitation ranges of values herein are merely intended to serve as a shorthand method of referring individually to each separate value falling within the range, unless otherwise indicated herein, and each separate value is incorporated into the specification as if it were individually recited herein.

The use of any and all examples, or exemplary language (e.g., "such as") provided herein, is intended merely to better illustrate the invention and does not pose a limitation on the scope of the invention.

A variety of modifications to the embodiments described herein will be apparent to those skilled in the art from the disclosure provided herein. Thus, the invention may be embodied in other specific forms without departing from the spirit or essential attributes thereof.

What is claimed is:

1. A system for managing airflow in a data center having at least one IT rack, comprising:
    a free-standing structure including a frame that defines an interior aisle and has two side openings, a ceiling opening and two end openings,
        wherein the frame includes four vertical support posts and two horizontal members,
        wherein the vertical support posts are located at corners of the frame,
        wherein the two horizontal members are each coupled to two vertical support posts,
        wherein at least one of the side openings of the frame is at least partially covered by a plurality of sidewall blanking panels that are removably coupled to the frame and are releasably coupled to each other, and
        wherein at least one of the side openings of the frame is at least partially covered by at least one IT rack;
    a door located at one or both end openings, to allow personnel access to the interior aisle; and
    an adjustable blanking panel extending downwards from one of the horizontal members of the frame to meet the top of an IT rack, wherein the adjustable blanking panel at least partially covers one of the side openings,
        wherein the sidewall blanking panels, door, adjustable blanking panel, and IT rack are configured to limit air from entering or exiting the interior aisle.

2. The system of claim 1, wherein the horizontal members each define a plurality of slots, and the sidewall blanking panels each define an upper protruding tab adapted to fit into one of the slots in one of the horizontal members.

3. The system of claim 1, wherein the frame further comprises one or more cross members, where each end of the cross member is coupled to one of the horizontal members.

4. The system of claim 3, further comprising at least one baffle frame comprising one or more baffles, and wherein the baffle frame is adapted to removably couple to at least one of the cross members.

5. The system of claim 1 wherein the ceiling opening is at least partially covered by one or more removable panels.

6. The system of claim 1, further comprising one or more side-sealing panels sized and shaped to fill space between the at least one IT rack and one of the sidewall blanking panels.

7. The system of claim 1, wherein the left and right sides of each of the sidewall blanking panels define a side flange adapted to allow each of the sidewall blanking panels to interlock with an adjacent sidewall blanking panel.

8. The system of claim 1, wherein at least one of the side openings of the frame is at least partially covered by at least two IT racks having different heights and/or different widths,
    wherein the sidewall blanking panels, door, and IT racks are configured to limit air from entering or exiting the interior aisle.

9. The system of claim 1, further comprising at least one cable tray extending between two of the vertical support posts, configured to receive at least one cable.

10. The system of claim 9, wherein the cable tray further includes two sides and a plurality of rungs extending between the two sides.

11. A kit for a system for managing airflow in a data center having at least one IT rack, comprising:
    a plurality of vertical support posts, at least two upper horizontal members, and at least two lower horizontal members configured to be assembled to form a generally rectangular frame having two side openings, a ceiling opening, and two end openings;
    one or more sidewall blanking panels configured to be removably coupled to at least one of the upper horizontal members, at least one of the lower horizontal members, and another sidewall blanking panel,
        wherein the one or more sidewall blanking panels is configured to at least partially cover at least one side opening of the frame when assembled;
    one or more cross members, wherein each end of the cross member is coupled to the upper horizontal members; and
    at least one baffle frame including one or more baffles, wherein the baffle frame is adapted to removably couple to at least one of the cross members.

12. The kit of claim 11, wherein the kit further includes:
    one or more adjustable blanking panels configured to be removably coupled to at least one of the upper horizontal members,
        wherein the one or more adjustable blanking panels is configured to extend from at least one of the upper horizontal members to a top panel of an IT rack when assembled; and
    one or more side-sealing panels configured to at least partially cover at least one side opening between one of the sidewall blanking panels and an IT rack when assembled.

13. The kit of claim 11, further comprising one or more removable panels configured to cover at least a portion of the ceiling opening when assembled.

14. The kit of claim 11, further comprising one or more air delivery/exhaust assemblies.

15. The kit of claim 11, further comprising at least one cable tray configured to extend along one of the horizontal members when assembled.

16. A data center airflow management structure comprising:
a frame defining an interior space having a floor, a ceiling, at least two side openings, and a ceiling opening,
wherein the frame is configured to receive at least one IT rack on the floor of the interior space;
a plurality of full height sidewall blanking panels extending from the floor to the ceiling of the interior space,
wherein the full height sidewall blanking panels are removably coupled to the frame and releasably coupled to each other,
wherein the full height sidewall blanking panels are configured to cover at least a portion of at least one side opening, and
wherein the frame and full height sidewall blanking panels are configured to operate with the at least one IT rack to cover the side openings of the frame.

17. The structure of claim 16, further comprising an adjustable blanking panel extending downwards from the ceiling of the interior space to meet the top of an IT rack.

18. The structure of claim 17, wherein the frame, full height sidewall blanking panels, and adjustable blanking panel are configured to operate with at least two IT racks of different heights and/or widths to cover the side openings of the frame.

19. The structure of claim 16, further comprising at least one cable tray extending along the frame, the at least one cable tray including two sides and a plurality of rungs extending between the two sides.

20. The structure of claim 19, wherein the frame is defined by four vertical support posts located at corners of the frame, and wherein the cable tray extends between two of the vertical support posts.

* * * * *